(12) United States Patent
Tim Iben et al.

(10) Patent No.: US 8,405,950 B2
(45) Date of Patent: Mar. 26, 2013

(54) CABLE HAVING ESD DISSIPATIVE LAYER ELECTRICALLY COUPLED TO LEADS THEREOF

(75) Inventors: Icko E. Tim Iben, Santa Clara, CA (US); Wayne Alan McKinley, Tucson, AZ (US); Sassan K. Shahidi, San Jose, CA (US); George G. Zamora, Vail, AZ (US)

(73) Assignee: International Business Machines Corporation, Armonk, NY (US)

( * ) Notice: Subject to any disclaimer, the term of this patent is extended or adjusted under 35 U.S.C. 154(b) by 1341 days.

(21) Appl. No.: 12/125,007

(22) Filed: May 21, 2008

(65) Prior Publication Data

US 2009/0290278 A1 Nov. 26, 2009

(51) Int. Cl.
*H01H 47/00* (2006.01)
(52) U.S. Cl. .................................................. 361/220
(58) Field of Classification Search ................ 361/212, 361/220; 174/117 FF
See application file for complete search history.

(56) References Cited

U.S. PATENT DOCUMENTS

| | | | | |
|---|---|---|---|---|
| 4,748,293 A | * | 5/1988 | Kikuchi et al. | 174/268 |
| 5,180,885 A | * | 1/1993 | Shah | 174/36 |
| 5,354,950 A | | 10/1994 | Golane | 174/35 |
| 6,507,467 B1 | * | 1/2003 | Schadewald et al. | 360/323 |
| 6,559,649 B2 | | 5/2003 | Deleu et al. | 324/457 |
| 7,223,922 B2 | * | 5/2007 | Bandy et al. | 174/254 |
| 7,285,846 B1 | * | 10/2007 | Tran | 257/667 |
| 7,525,047 B2 | * | 4/2009 | Iben et al. | 174/117 FF |
| 7,538,986 B2 | * | 5/2009 | Iben | 360/323 |
| 2003/0218851 A1 | * | 11/2003 | Harris et al. | 361/118 |
| 2006/0098351 A1 | | 5/2006 | Iben | 360/323 |
| 2007/0146941 A1 | * | 6/2007 | Harris et al. | 361/18 |
| 2007/0284133 A1 | | 12/2007 | Iben et al. | 174/102 |
| 2008/0078568 A1 | * | 4/2008 | Lin | 174/115 |

FOREIGN PATENT DOCUMENTS

JP 2003124581 A * 4/2003

OTHER PUBLICATIONS

U.S. Appl. No. 11/626,802, filed Jan. 24, 2007.
U.S. Appl. No. 11/781,850, filed Jul. 23, 2007.

* cited by examiner

*Primary Examiner* — Ronald W Leja
(74) *Attorney, Agent, or Firm* — Zilka-Kotab, PC (57) ABSTRACT

A cable having an electrostatic discharge (ESD) dissipative layer in one embodiment includes a plurality of leads; an ESD dissipative layer; and a coupling layer between the leads and the ESD dissipative layer, the coupling layer electrically connecting each of the leads, individually, to the ESD dissipative layer. A cable having an electrostatic discharge (ESD) dissipative layer in another embodiment comprises at least 16 leads; an ESD dissipative layer; and a coupling layer between the leads and the ESD dissipative layer, the coupling layer electrically connecting each of the leads, individually, to the ESD dissipative layer. A method for fabricating a cable in one embodiment comprises coupling an electrostatic discharge (ESD) dissipative layer to a plurality of leads using a coupling layer between the leads and the ESD dissipative layer, the coupling layer electrically connecting each of the leads, individually, to the ESD dissipative layer.

20 Claims, 6 Drawing Sheets

CABLE HAVING ESD DISSIPATIVE LAYER ELECTRICALLY COUPLED TO LEADS THEREOF

FIELD OF THE INVENTION

The present invention relates to cables, and more particularly, this invention relates to cables having an electrostatic discharge (ESD) conductive layer electrically coupled to the leads thereof.

BACKGROUND OF THE INVENTION

Magnetic head-based systems have been widely accepted in the computer industry as a cost-effective form of data storage. In a magnetic tape drive system, a magnetic tape containing a multiplicity of laterally positioned data tracks that extend along the length of the tape is drawn across a magnetic read/write transducer, referred to as a magnetic tape head. The magnetic tape heads can record and read data along the length of the magnetic tape surface as relative movement occurs between the heads and the tape.

In a magnetic disk drive system, a magnetic recording medium in the form of a disk rotates at high speed while a magnetic head "flies" slightly above the surface of the rotating disk. The magnetic disk is rotated by means of a spindle drive motor.

Magnetoresistive (MR) sensors are particularly useful as read elements in magnetic heads, used in the data storage industry for high data recording densities. Three examples of MR materials used in the storage industry are anisotropic magnetoresistive (AMR), giant magnetoresistive (GMR) and tunneling magnetoresistive (TMR). An MR sensor is one whose resistance is changed by a magnetic field. MR, e.g., AMR, GMR and TMR, sensors are deposited as small and thin multi-layered sheet resistors on a structural substrate. The sheet resistors can be coupled to external devices by contact to metal pads which are electrically connected to the sheet resistors. MR sensors provide a high output signal which is not directly related to the head velocity as in the case of inductive read heads.

To achieve the high areal densities required by the data storage industry, the sensors are made with commensurately small dimensions. The smaller the dimensions, the more sensitive the thin film resistors become to damage from spurious current or voltage spikes.

A major problem that is encountered during manufacturing, handling and use of MR sheet resistors as magnetic recording transducers is the buildup of electrostatic charges on the various elements of a head or other objects which come into contact with the sensors, particularly sensors of the thin film type, and the accompanying spurious discharge of the static electricity thus generated. Static charges may be externally produced and accumulate on instruments used by persons performing head manufacturing or testing function. These static charges may be discharged through the head, causing physical and/or magnetic damage to the sensors.

As described above, when a head is exposed to voltage or current inputs which are larger than that intended under normal operating conditions, the sensor and other parts of the head may be damaged. This sensitivity to electrical damage is particularly severe for MR read sensors because of their relatively small physical size. For example, an MR sensor used for high recording densities for magnetic tape media (on the order of 25 MBytes/cm$^2$) are patterned as resistive sheets of MR and accompanying materials, and will have a combined thickness for the sensor sheets on the order of 500 Angstroms (Å) with a width of a few microns (µm) and a height on the order of 1 µm. Sensors used in extant disk drives are even smaller. Discharge currents of tens of milliamps through such a small resistor can cause severe damage or complete destruction of the MR sensor. The nature of the damage which may be experienced by an MR sensor varies significantly, including complete destruction of the sensor via melting and evaporation, oxidation of materials at the air bearing surface (ABS), generation of shorts via electrical breakdown, and milder forms of magnetic or physical damage in which the head performance may be degraded. Short time current or voltage pulses which cause extensive physical damage to a sensor are termed electrostatic discharge (ESD) pulses.

One major source of ESD damage is associated with tribocharging of the flexible cables used to attach the heads to the external devices. High magnitude currents sufficient to damage a head can occur when the cables are tribocharged and the distal end of the cable makes electrical contact with an external device or piece of metal. The resultant discharge may result in damage as described above.

Another potential cause of ESD damage to sensitive electronics is the creation of a potential difference between two different elements within a device. An approach to protect against this damage is to connect the elements together on the wafer. However, this approach can be costly. Furthermore, in the case of tape heads, due to the large number of elements in a tape head, space on the wafer is limited and can preclude attaching resistive elements onto the wafer for this purpose.

Another major cause of ESD damage is termed machine-model (MM) ESD. MM ESD occurs when a differential in voltages exists between an element (sensor) which is bonded onto a cable and an external tester or device to which the cable is attached. When the sensor is attached directly to the external tester or device, high level currents can flow to equalize the voltages. The high current levels can cause damage to the sensor. A common practice to protect the sensors from damage is use a high impedance connection to the ground potential of any tester/device or tool (external device) to which the sensor is to be connected in order to equalize the voltage potential of the sensor and the external device prior to connecting the sensors with a low resistance connection for use or test. Such an approach would be to bridge the element lead connections to the external device with a high impedance resistor prior to attaching to the external connector. An external resistor, though, can add significant capacitance between the element and the resistive element and may not work. Also, this approach can be difficult to execute in a manufacturing environment. In order to function properly, the minimum amount of capacitance should introduced be between the sensor and the high impedance device to avoid charge build up which can damage the sensor. An approach is to attach a high impedance resistor directly onto a cable which is attached to the device elements (e. readers and writers). This, though, requires costly alignment and bonding tools.

Another approach which solves part of the problem is to use an ESD dissipative sheet with an insulating adhesive layer to bond the dissipative sheet above the leads. While this serves to mitigate tribocharging of the cable, it does not solve the problem of MM ESD.

In summary, the detractors of current solutions are: cost, lack of space, and the need for multiple solutions to solve the different problems.

SUMMARY OF THE INVENTION

A cable having an electrostatic discharge (ESD) dissipative layer in one embodiment includes a plurality of leads; an ESD dissipative layer; and a coupling layer between the leads and the ESD dissipative layer, the coupling layer electrically connecting each of the leads, individually, to the ESD dissipative layer.

A cable having an electrostatic discharge (ESD) dissipative layer in another embodiment comprises at least 16 leads; an ESD dissipative layer; and a coupling layer between the leads and the ESD dissipative layer, the coupling layer electrically connecting each of the leads, individually, to the ESD dissipative layer.

A method for fabricating a cable in one embodiment comprises coupling an electrostatic discharge (ESD) dissipative layer to a plurality of leads using a coupling layer between the leads and the ESD dissipative layer, the coupling layer electrically connecting each of the leads, individually, to the ESD dissipative layer.

Any of these embodiments may be implemented in a magnetic data storage system such as a tape drive system, which may include a magnetic head as recited above, a drive mechanism for passing a magnetic medium (e.g., recording tape) over the magnetic head, and a controller electrically coupled to the magnetic head.

Other aspects, advantages and embodiments of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

In the drawings, like and equivalent elements are numbered the same throughout the various figures.

The following description discloses several preferred embodiments of cables having an ESD dissipative portion for protecting delicate components of an electronic device from ESD and/or Electrical Overstress (EOS) damage.

One general embodiment of the present invention includes a cable comprising a plurality of leads, an ESD dissipative layer, and a coupling layer between the leads and the ESD dissipative layer. The coupling layer electrically connects each of the leads, individually, to the ESD dissipative layer.

Another general embodiment of the present invention includes a cable comprising at least 16 leads, an ESD dissipative layer, and a coupling layer between the leads and the ESD dissipative layer, the coupling layer electrically connecting each of the leads, individually, to the ESD dissipative layer.

Yet another general embodiment of the present invention includes a method for fabricating a cable, the method comprising coupling an electrostatic discharge (ESD) dissipative layer to a plurality of leads using a coupling layer between the leads and the ESD dissipative layer, the coupling layer electrically connecting each of the leads, individually, to the ESD dissipative layer.

Note that while various figures described herein are shown with dissimilar stacks of layers on either side of the leads, variations of the cables may include similar stacks of layers on opposite sides of the cable, and even multiple coupling, ESD dissipative, and/or other layer on one or both sides of the leads.

In various embodiments, one or more ESD dissipative layers on or in a cable connect the leads together with high resistance contacts. Accordingly, various embodiments solve issues related to both cable tribocharging and ESD damage from the charge device model type (CDM) and MM. In such embodiments, the ESD dissipative layer is electrically connected to the cable leads and serves as an ESD dissipative connection between the leads.

Figure 1:
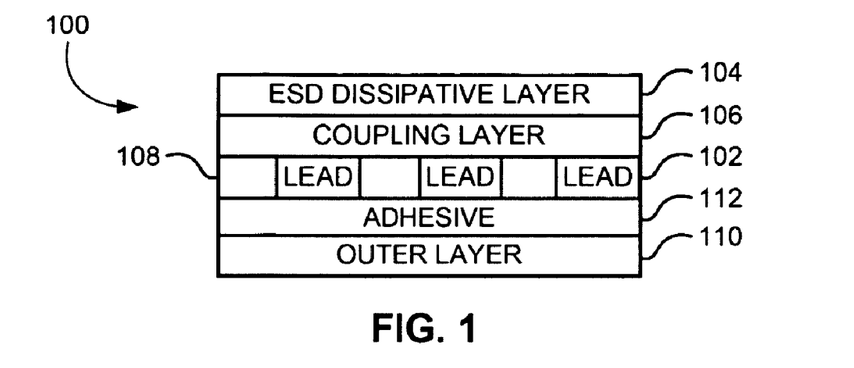
FIG. 1 is a simplified partial cross sectional view, not to scale, of a cable having an ESD dissipative layer according to one embodiment.

FIG. 1 illustrates a partial cross section of a cable 100 having leads 102 of a metal or other conductive material, a coupling layer 106 skirting the leads 102, an ESD dissipative layer 104 electrically coupled to the leads 102 via the coupling layer 106. An insulating layer 108 separates the leads. An adhesive layer 112 couples an outer layer 110 to the leads 102. The outer layer 110 is preferably electrically insulative, but need not be. Note that layers can be added or removed per the desires of the designer or requirements of the particular application.

Figure 2:
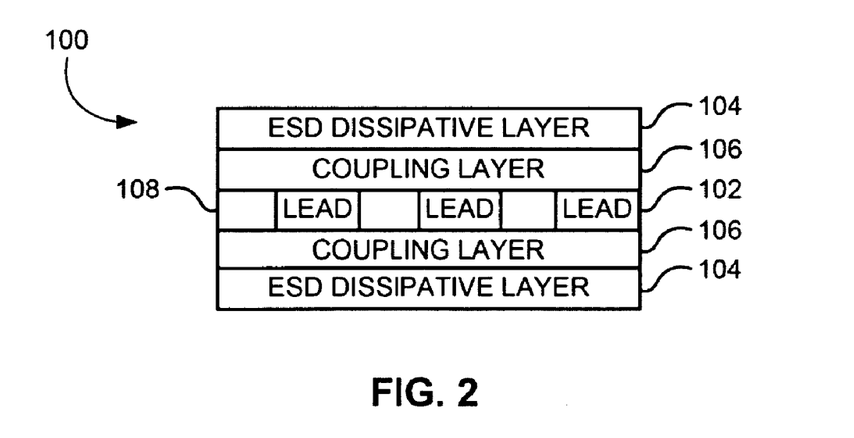
FIG. 2 is a simplified partial cross sectional view, not to scale, of a cable having ESD dissipative layers according to one embodiment.

FIG. 2 illustrates a cross section of a cable 100 having leads 102 of a metal or other conductive material, coupling layers 106 skirting the leads 102, and ESD dissipative layers 104 coupled to the coupling layers 106. Note that layers can be added or removed per the desires of the designer or requirements of the particular application.

Figure 3:
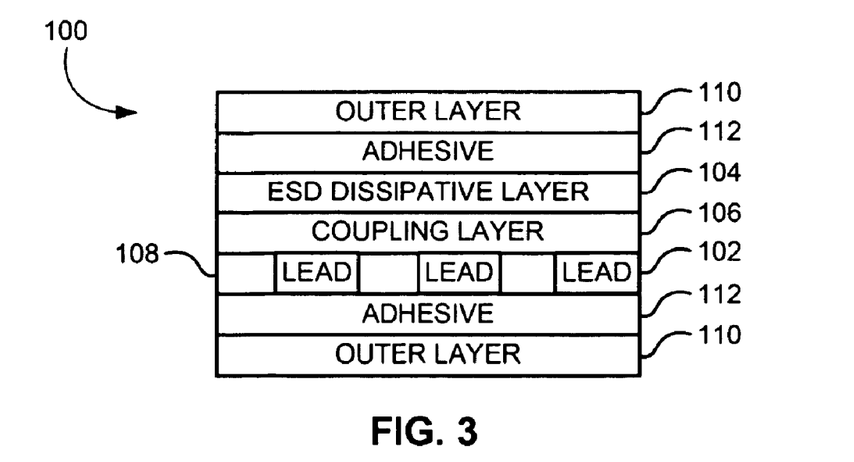
FIG. 3 is a simplified partial cross sectional view, not to scale, of a cable having an ESD dissipative layer according to one embodiment.

FIG. 3 illustrates a cross section of a cable 100 having leads 102 of a metal or other conductive material, an ESD dissipative layer 104 coupled to the leads 102 by the coupling layer 106, and adhesive layers 112 coupling outer layers 110 to the cable 100. The outer layers 110 are preferably electrically insulative, but need not be. To allow the aforementioned visual inspection of the lead 102, at least one of the backing layers 202 and a corresponding ESD dissipative layer 104 is at least one of translucent, semi-transparent or transparent. Note that layers can be added or removed per the desires of the designer or requirements of the particular application.

The coupling layer may take many forms. In some embodiments, the coupling layer is non-homogenously electrically conductive across a width thereof in a direction perpendicular to a plane of the coupling layer (in other words, the coupling layer is electrically insulative between ends opposite each other in a direction parallel to the plane of the coupling layer.

In one approach, the coupling layer comprises an anisotropic conductive film (ACF). ACF provides three functions: bonding, conduction in a direction perpendicular to its plane, and insulation in the plane direction. In general, ACF includes particles of electrically conductive material embedded in a nonconductive adhesive. In use, the ACF is placed between the leads and ESD dissipative layer. The lead/ACF/ESD dissipative layer stack is then heated and compressed. The particles of electrically conductive material in the ACF contact the leads and the ESD dissipative layer, providing an electrical connection therebetween. Because the particles are isolated in the horizontal plane by the adhesive, current does not flow along the horizontal plane, maintaining isolation between the horizontally located leads. One suitable type of ACF is CP9652KST, sold by Sony Chemical Corporation of America, 1001 Technology Drive, Mount Pleasant, Pa. 15666 USA.

In another approach, the coupling layer comprises an adhesive having a thickness no greater than that which provides electrical communication between the leads and the ESD dissipative layer in a direction perpendicular to the plane of the coupling layer. For example, the coupling layer be an adhesive layer thick enough to bond the ESD dissipative layer to the leads, but thin enough so sufficient electrical connection is made between the leads and the ESD dissipative layer. Accordingly, the adhesive may be a good electrical conductor, a poor electrical conductor (e.g., resistive), or anything in between.

In a further approach, the coupling layer comprises an ESD dissipative adhesive to bond the ESD dissipative layer to the cable leads. The ESD dissipative properties of the adhesive may be homogenous thereacross. Suitable ESD dissipative adhesives are described in U.S. patent application Ser. No. 12/125,001, filed concurrently herewith under title "Systems Having Components Coupled with Electrostatic Dissipative Adhesive" to Bandy et al. and assigned to International Business Machines Corporation, which is herein incorporated by reference.

Yet another approach uses a conductive adhesive to bond only over the area of the leads. However, such an approach is not preferred due to the small dimensions of typical leads, and would require special alignment tools.

The ESD dissipative layer preferably has a thickness sufficient to exhibit an ESD surface resistivity in the range of about $10^6$ to about $10^{12}$ ohms/sq (ohms per square). In particularly preferred embodiments, the ESD dissipative surface resistivity is in the range of about $1 \times 10^6$ to $1 \times 10^8$ ohms/sq. For example, one illustrative embodiment has an ESD dissipative surface resistivity in the range of about $0.5 \times 10^7$ to about $1.5 \times 10^7$ ohm/sq. In a further embodiment, the ESD dissipative surface resistivity is about $1 \times 10^7$ ohms/sq. An ESD conductive layer of the cable in the disclosed range of conductivity should not conduct substantial RF or EMI currents, but serves as an ESD dissipative connection between the leads in the cable.

In various embodiments, an ESD dissipative layer is an external layer of the cable. However, the ESD dissipative layer can also be embedded in the cable, partially exposed, etc.

The ESD dissipative layer may extend across a substantial portion of a particular side, or both sides, of the cable, e.g., >50%, more preferably >80%, even more preferably >90% of the surface area of the particular side (or sides) of the cable. The ESD dissipative layer may also extend across an entire length of one or both sides of the cable. In other approaches, the ESD dissipative layer may be smaller, bridging only a section of the cable.

Where the electrical properties of the ESD dissipative layer are homogeneous, no precision alignment with the leads is required, substantially reducing the production costs.

Figure 4A:
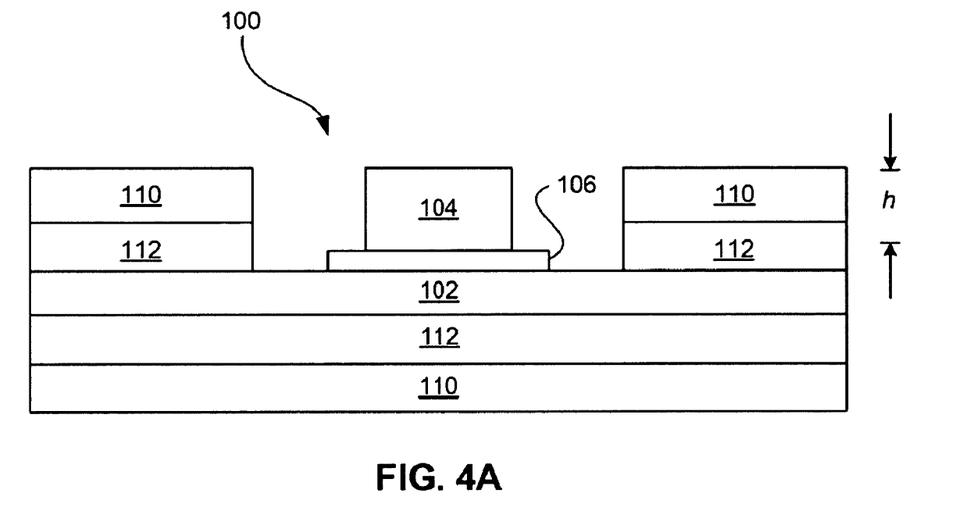
FIG. 4A is a partial top view, not to scale, of a cable having an ESD dissipative layer applied through a section of the cable where the metal leads are exposed.
Figure 4B:
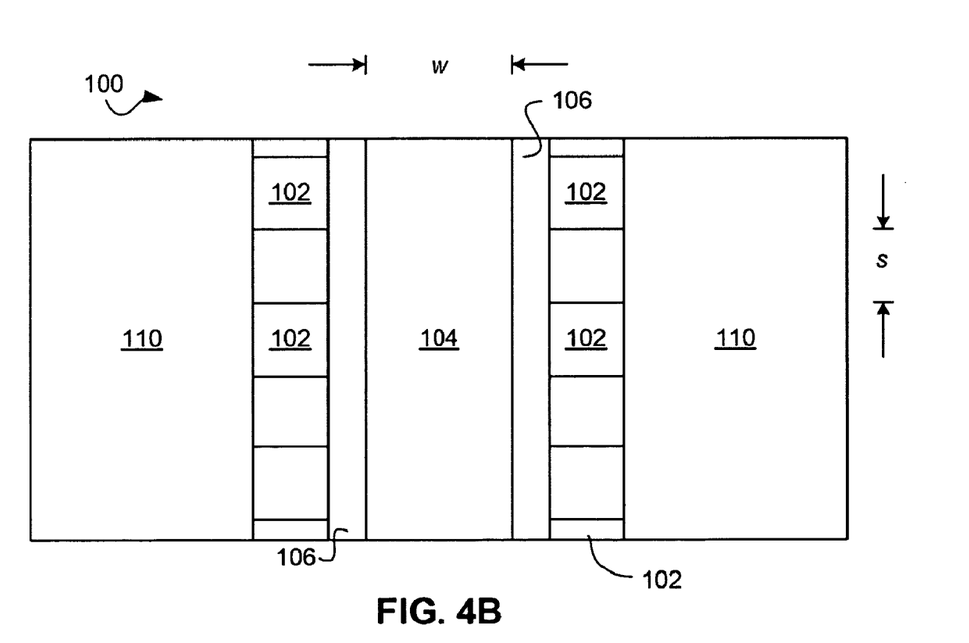
FIG. 4B is a top down view of FIG. 4A.
Figure 5A:
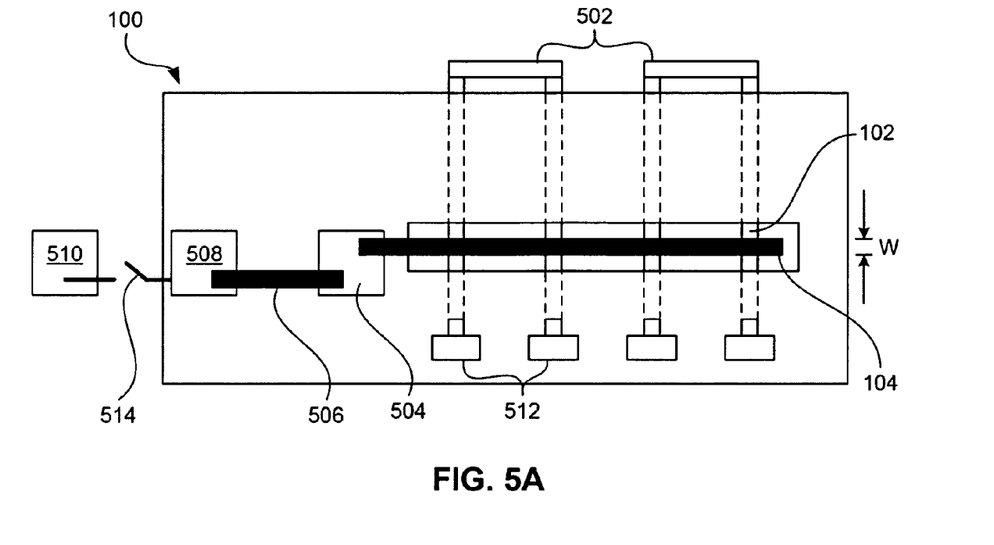
FIG. 5A is a partial system diagram, not to scale, of a system comprising a cable having an ESD dissipative layer according to one embodiment.
Figure 5B:
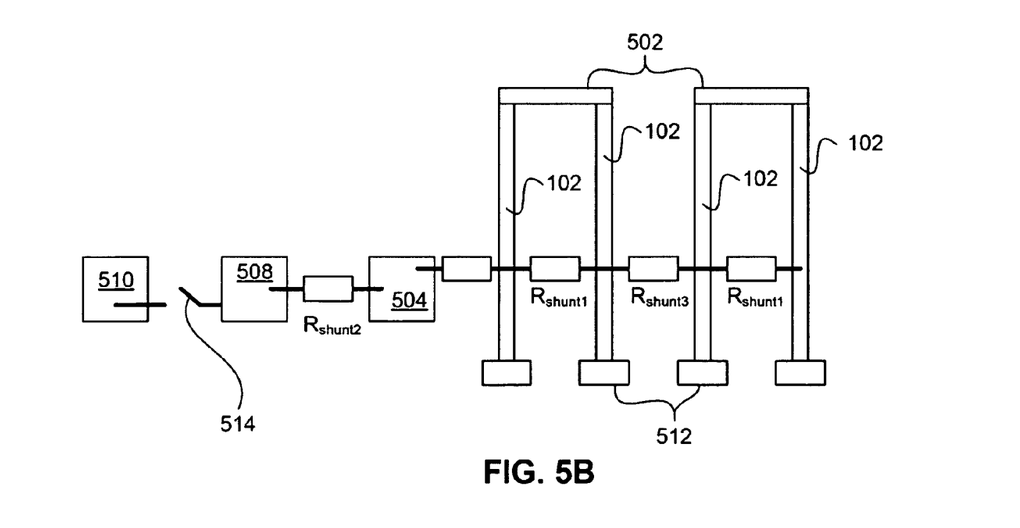
FIG. 5B is a simplified equivalent circuit of the embodiment shown in FIG. 5A.
Figure 6A:
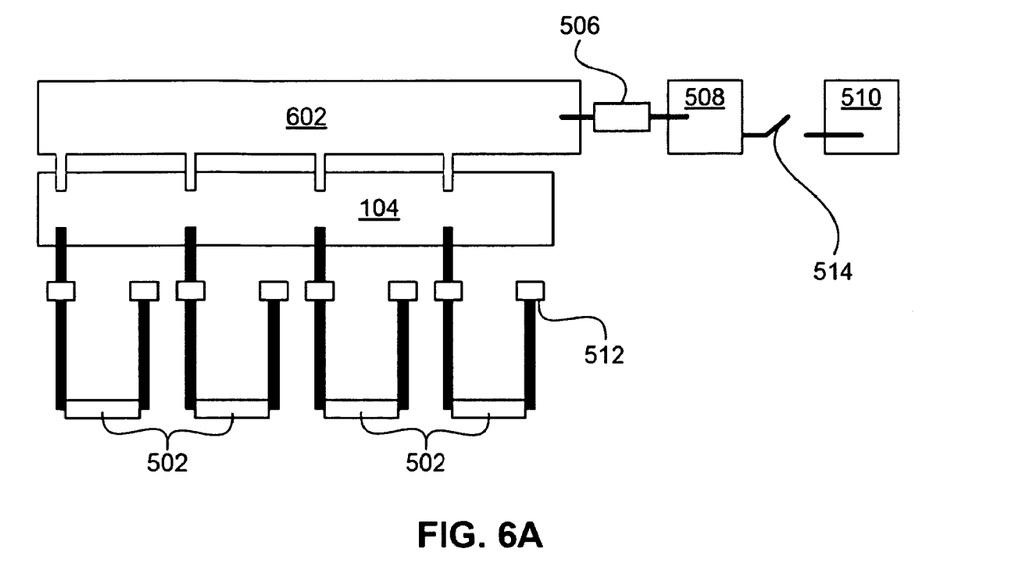
FIG. 6A is a partial system diagram, not to scale, of a system comprising a cable having an ESD dissipative layer, and a conductive bar, according to one embodiment.
Figure 6B:
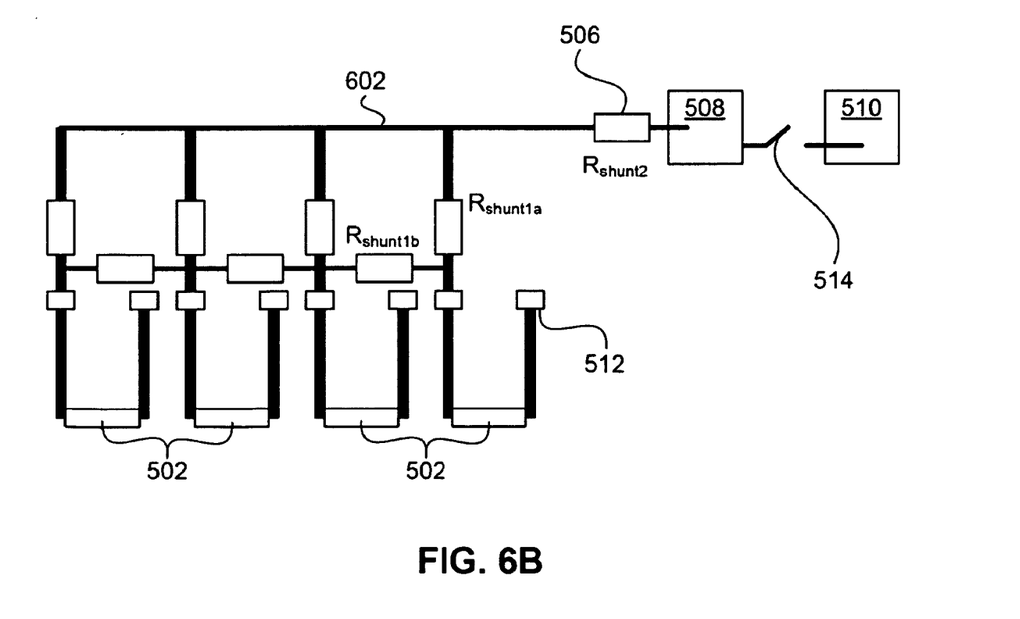
FIG. 6B is a simplified equivalent circuit of the embodiment shown in FIG. 6A.

In a further approach, the ESD dissipative layer and the coupling layer may be positioned in a window of the cable. Accordingly, the ESD dissipative layer can be added after fabrication of the cable. This approach may also allow removal of the ESD dissipative layer. FIG. 4A is a partial top view of a cable 100 having an ESD dissipative layer 104 applied through a section of the cable where the metal leads 102 are exposed, e.g., through a window in the cable. FIG. 4B is a top down view of FIG. 4A. Preferably, the window is contiguous, but could also be broken into individual sections.

The particular composition of the ESD dissipative layer 104 is not critical. One suitable ESD dissipative materials for forming the ESD dissipative layer is SPEC-STAT® ESD CLEAR #618-1-220 available from Lasco Services, 601 Compton, Irving, Tex. 75061. Another is SPEC-STAT® ESD CLEAR #618-1-200 from Lasco Services. Experimentation has shown that when a cable coated with SPEC-STAT® ESD CLEAR #618-1-220 is rubbed with a nitrile glove ten times, the cable does not display any significant surface charge (<10V versus >1000V if KAPTON is rubbed). Yet another is the "Antistatic PET Film" from Hangzhou Dahua Plastics Industry, Co., Ltd., 397 Tianmushan Road, Hangzhou P. R. C 310023, and having a light transmission of 88% per test method ASTM D1003 and a surface resistivity of $1 \times 10^9$ ohms/sq per test method GB/T13541. Yet another material is static dissipative polyethylene.

For a resistive sheet of width w and separation s between leads (FIG. 4B), the shunt resistance ($R_{shunt}$) is given by:

$$R_{shunt} = R_{sheet} * s/w \qquad \text{Equation 1}$$

TABLE 1

| Material | Rubbed with Nitrile glove Voltage (Volts) | Peeling off from paper Voltage (Volts) |
|---|---|---|
| Kapton XC 10^7 ohm/sq | Insignificant | Insignificant |
| Kapton CPB 10^12 ohm/sq | 50-400 | >3000 |
| LCP 3600 F02053 | 200-3000 | >3000 |
| Kapton/Pyralux, LF7001 Dupont | >1000 | >3000 |
| LCP 3800 | >1500 | >3000 |
| LCP 212141 | >1000 | >3000 |

Expanding on the results shown in Table 1, rubbing a cable (KAPTON CBP (polyimide) cleaned with isopropyl alcohol) with nitrile gloves charges the cable to over 250+100V.

Rubbing a clean sheet (Kapton LF7001 (polyimide)) with a finger or nitrile gloves charges the cable to over 1600V. Charge dissipation times are: 11, 102 and 450 seconds for 75%, 50%, 90% dissipation, respectively. The external voltage from the charged surface is dramatically shielded when the KAPTON sheet is placed over a metal (aluminum foil) but the external voltage "reappears" when the metal sheet is removed, indicating that the metal sheet insulated the charges on the KAPTON from external detection without removing the charges, thus hiding the potentially damaging charges from detection. The voltage with height drops by ~3.4% per mm.

Rubbing a clean cable (Kapton XC (polyimide with a small percentage of conductive graphite, $10^7$ $\Omega$/sq)) with nitrile gloves results in no noticeable tribocharging, even when holding with an insulator.

The cables thus described with an ESD dissipative layer are effectively immune to charge build up and thus eliminate this mechanism as a source of ESD or EOS damage. The cables described herein are suitable for use with any device or electronic component for which ESD or EOS protection is desired. The cables are especially useful when coupled to MR sensors in magnetic storage devices such as tape drives and disk drives.

Further, the preferred methods thus described do not significantly affect the cable mechanical properties such as bending stiffness or weight, making them preferable to other ESD and EOS prevention devices whose weight can interfere with actuation of the tape or disk heads.

Choice of Resistance Values for Shunts

One preferred criteria for choosing the resistance value ($R_{shunt1}$ or $R_{shunt3}$) for the connection used to electrically connect elements within the cable together is to maintain an equipotential voltage between the elements during fabrication and assembly processes while not significantly affecting the performance of the device. For maintaining an equipotential between the devices, the choice of a shunt resistance is to be as low as possible. For not affecting the performance of the device, the shunt resistance should be as high as possible.

As an example, take $R_{shunt1}$ to be across an element of resistance $R_{dut}$. The ratio ($R_{dut}/R_{shunt1}$) gives the leakage current through $R_{shunt1}$ rather than through $R_{dut}$. Since leakage current results in signal loss, this degrades performance and is undesirable. For magneto resistive (MR) heads used in tape drives, a 0.1% loss of signal is acceptable. For AMR, GMR and TMR readers, the resistance values are usually between 25 and 400$\Omega$. Thus, an acceptable choice for $R_{shunt1}$ based on not affecting the performance would be values between 25 k$\Omega$ and 400 k$\Omega$, with the lower and higher range values being used for the lower and higher values of the readers.

The next criteria to verify would be whether the values of $R_{shunt3}$ might be too high to achieve rapid equilibration of the different head elements. In a cable, one means of charging the cable which could lead to different local voltage potentials would be Tribocharging. Tribocharging events are mechanical in nature, and thus are slower than the microsecond range, and often are in the ms range. Typical capacitance values of leads in a cable are of the order of 10 pf. Thus, with resistive connectors between 25% and 400 k$\Omega$, the RC time constant is between 2.5 to 40 ns. Thus, the leads would remain at an equipotential voltage during the Tribocharging event.

In tape and HDD heads, both readers and writers are placed on the same cables. The resistance/impedance of the writers are usually ~15 to 20$\Omega$, and so the same criteria apply to the writers for an internal short as was discussed for the readers. Furthermore, the readers and writers do not function simultaneously, so additional pick-up of the write signals by the readers is not important from a performance perspective. However, it is important to minimize the loss of the write signal through the read lines and visa versa. A simple calculation shows that a shunt between a reader and a writer of greater than 10 k$\Omega$ does not cause substantial leakage. As an example, taking a writer with an impedance ($R_{write}$), a write current ($I_{write}$), and a shunt resistance ($R_{shunt3}$) the leakage current from the writer to the reader is of the order of $I_{write}$ ($R_{write}/R_{shunt3}$). For an $R_{write}$ of 20$\Omega$ and an $R_{shunt1}$ of 10 k$\Omega$, the leakage current into the reader is 0.2% of the write current. For an $I_{write}$ of 20 mA, the leakage current would be 0.04 mA, which would not cause damage to any modern day sensor used in the magnetic media storage industry.

One additional element which is located on a tape drive head is a servo, which is an MR reader which is used to align the readers and writers in the proper track on the tape. The servos are sensitive to ESD damage and should also have the dissipative connections ($R_{shunt1}$). Though some tape products do same-gap-servo tracking so that the servos are reading data at the same time as the writers on the same cabled module are operating, since the servos operate at a frequency outside the range of the writers, the writer leakage can be further suppressed, through the use of filters.

Dissipative Shunt to External Devices

The third choice of resistance values would be for the resistor ($R_{shunt2}$) which connects the elements to external devices. $R_{shunt2}$ is optimally located on the cable in order to minimize the capacitance between the elements and $R_{shunt2}$. $R_{shunt2}$ is chosen to minimize the current through or the voltage across the elements. Taking the circuit to be a simple RC circuit of capacitance C and dissipative resistance to be $R_{shunt2}$, $R_{dut} \ll R_{shunt2}$, then the RC time constant for dissipation is: $\tau_{RC} \sim CR_{shunt2}$. For a voltage difference between the cable and the external device of V, the charge on the cable ($Q_o$) is CV. The peak current, then is: $I_{peak} = Q_o/\tau_{RC} = V/R_{shunt2}$. The peak voltage across the element of resistance $R_{dut}$, then would be: $V_{peak} = V(R_{dut}/R_{shunt2})$, which drops the value of the voltage differential by the ratio of the device resistance to the shunt resistance, indicating as high a value for $R_{shunt2}$ as possible for protection. The upper limit of $R_{shunt2}$, then would be from a practical value for testing purposes. Assuming that the cable capacitance is substantially lower than the test device capacitance, the cable will reach the test device voltage within a time $\tau_{RC}$. With a device resistance of 100$\Omega$ and a value of 10 pf for C, $R_{shunt2}$ values of 100 k$\Omega$ to 10 M$\Omega$ would yield voltage protection suppressions of between a factor of 1 k and 100 k, and discharge times of between 1 and 100 microseconds. Thus, resistance values for $R_{shunt2}$ within this range are reasonable.

Figure 7:
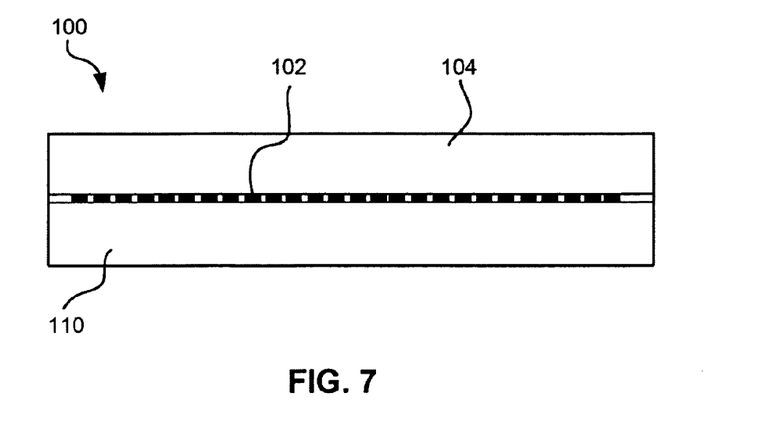
FIG. 7 is a simplified cross sectional view, not to scale, of a cable having multiple leads according to one embodiment.

FIG. 7 depicts a cross section of an illustrative cable 100 similar to that of FIG. 1, taken perpendicular to a longitudinal axis of the cable. Several leads 102 are shown, though the number of leads is not critical. One skilled in the art will appreciate that the number of leads in a particular implementation will depend primarily on the intended application of the cable.

Figure 8:
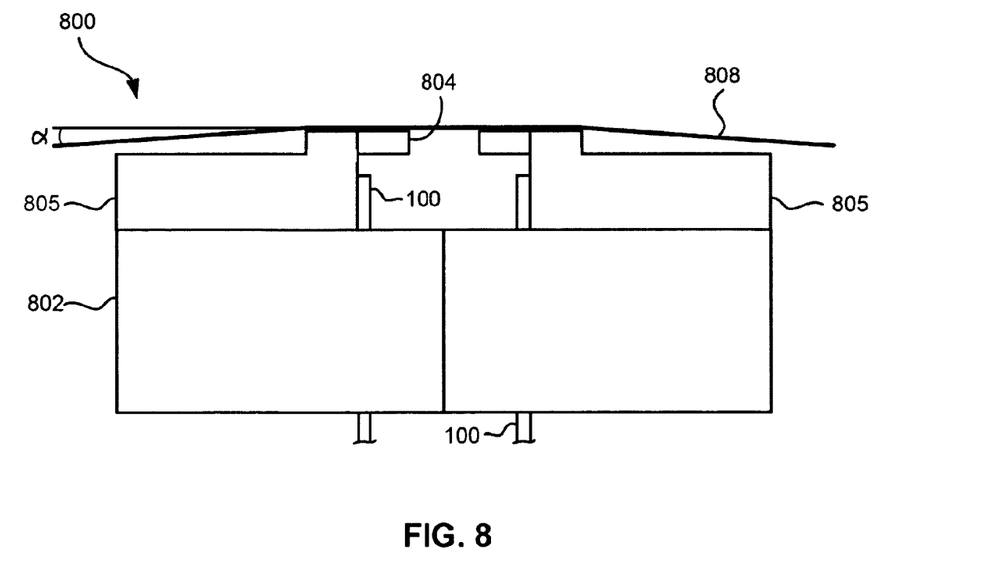
FIG. 8 is a partial side view of a tape head in use.

FIG. 8 illustrates a cable 100 in use. As shown, FIG. 8 illustrates a completed head for a read-while-write bidirectional linear tape drive. "Read-while-write" means that the read element follows behind the write element. This arrangement allows the data just written by the write element to be immediately checked for accuracy and true recording by the trailing read element. Specifically, in FIG. 8, a tape head 800 comprising two modules 805 are mounted on a ceramic substrate 802 which are, in turn, adhesively or otherwise physically coupled. Each of the modules 805 includes several read sensors and/or write transducers electrically coupled to pads (not shown) for subsequent attachment to external electronic devices. Closures 804 are coupled to the modules 805 to support the tape and protect the read/write elements from wear by the tape. Conductive leads in the cables 100 are fixedly and electrically coupled to the pads. The tape 808 wraps over the modules 805 at a predetermined wrap angle α. The closures 804 are typically angled relative to each other such that the tape 808 wraps over the closures 804 at a predetermined wrap angle.

Figure 9:
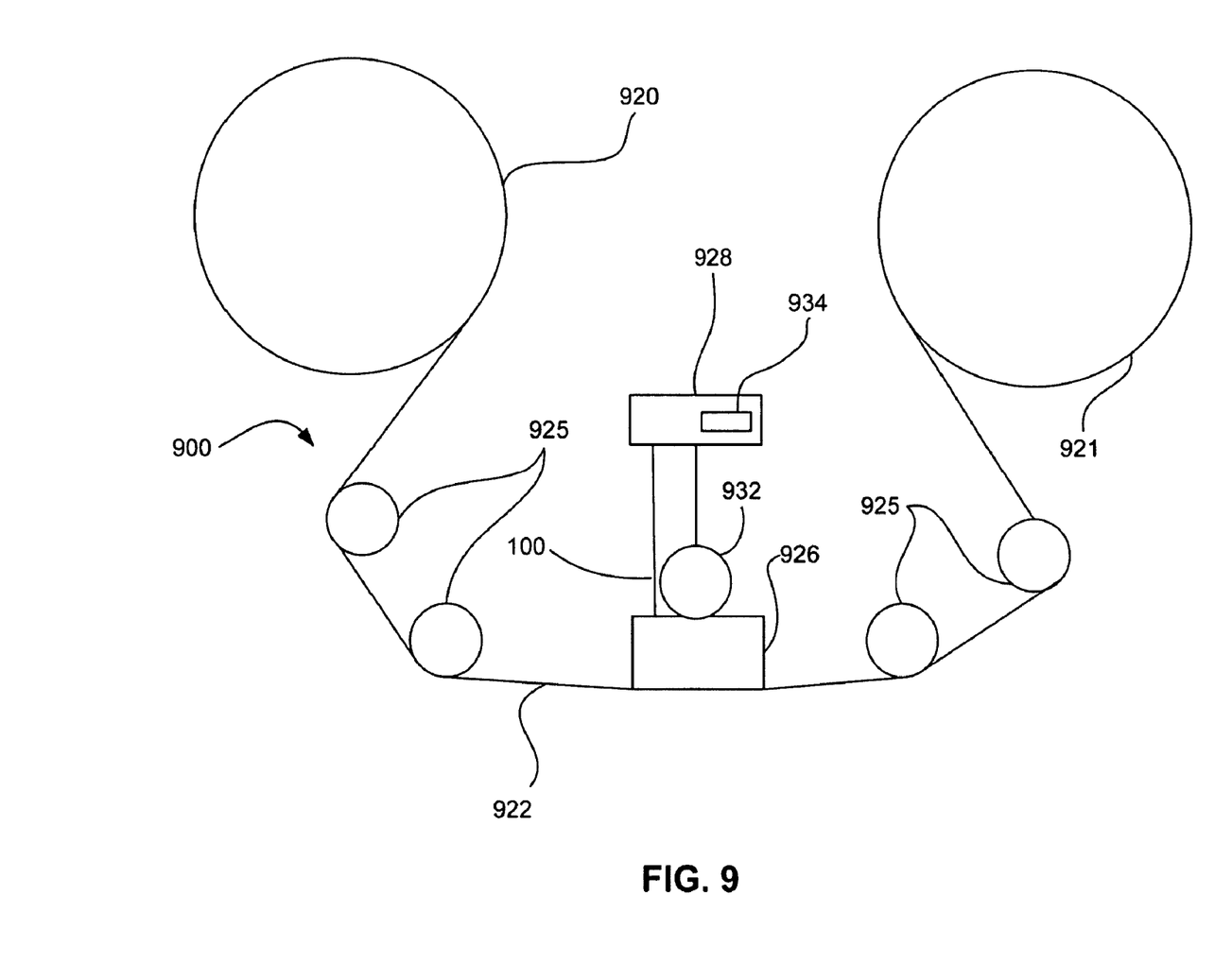
FIG. 9 is a schematic diagram of a simplified tape drive system according to one embodiment.

FIG. 9 illustrates a simplified tape drive 900 of a tape-based data storage system, which may be employed in the context of the present invention. While one specific implementation of a tape drive is shown in FIG. 9, it should be noted that the embodiments described herein may be implemented in the context of any type of tape drive system.

As shown, a tape supply cartridge 920 and a take-up reel 921 are provided to support a tape 922. One or more of the reels may form part of a removable cassette and are not necessarily part of the system 900. The tape drive, such as that illustrated in FIG. 9, may further include drive motor(s) to drive the tape supply cartridge 920 and the take-up reel 921 to move the tape 922 over a tape head 926 of any type.

Guides 925 guide the tape 922 across the tape head 926. Such tape head 926 is in turn coupled to a controller assembly 928 via a cable 100. The controller 928 typically controls head functions such as servo following, writing, reading, etc. The cable 100 may include read/write circuits to transmit data to the head 926 to be recorded on the tape 922 and to receive data read by the head 926 from the tape 922. An actuator 932 controls position of the head 926 relative to the tape 922.

An interface may also be provided for communication between the tape drive and a host (integral or external) to send and receive the data and for controlling the operation of the tape drive and communicating the status of the tape drive to the host, all as will be understood by those of skill in the art.

Although various embodiments have been described as adapted for use with a magnetic tape storage system, the inventive cables may also be used with other electronic devices such as magnetic recording systems and applications using a sensor to detect a magnetic field, optical storage devices, wireless telephones, personal computers, PDAs, etc.

Further, while the foregoing description focuses on a cable, the teachings herein may be applied a PCB board.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A cable having an electrostatic discharge (ESD) dissipative layer, comprising:
   a plurality of leads;
   an ESD dissipative layer; and
   a coupling layer between the leads and the ESD dissipative layer,
   the coupling layer electrically connecting each of the leads, individually, to the ESD dissipative layer.

2. A cable as recited in claim 1, wherein the ESD dissipative layer has an ESD dissipative surface resistance of from about $1\times10^6$ to about $1\times10^{12}$ olun/sq.

3. A cable as recited in claim 1, wherein the ESD dissipative layer has an ESD dissipative surface resistance of from about $1\times10^6$ to about $1\times10^8$ ohm/sq.

4. A cable as recited in claim 1, wherein the ESD dissipative layer also functions as an electrical insulator for the lead for protecting the leads from metal-to-metal contact with external metal devices such as tools or fixtures.

5. A cable as recited in claim 4, wherein no other insulator excluding the coupling layer is present.

6. A cable as recited in claim 1, wherein the ESD dissipative layer extends across a substantial portion of one side of the cable.

7. A cable as recited in claim 1, wherein the ESD dissipative layer and the coupling layer are positioned in a window of the cable.

8. A cable as recited in claim 1, wherein the coupling layer comprises an anisotropic conductive film.

9. A cable as recited in claim 1, wherein the coupling layer comprises an ESD dissipative adhesive.

10. A cable as recited in claim 1, wherein the coupling layer comprises an adhesive having a thickness no greater than that which provides electrical communication between the leads and the ESD dissipative layer in a direction perpendicular to the plane of the coupling layer.

11. A cable as recited in claim 1, further comprising an electrically conductive bar, the ESD dissipative layer coupling the leads to the bar.

12. A cable as recited in claim 11, further comprising a pad, the bar being electrically coupled to the pad by an electrostatically dissipative material.

13. A cable as recited in claim 1, further comprising a pad, the ESD dissipative layer being electrically coupled to the pad.

14. A cable as recited in claim 1, wherein at least 16 leads are present in the cable; further comprising an antistatic layer, further comprising an electrically conductive bar, the ESD dissipative layer coupling the leads to the bar; further comprising a pad, the bar being electrically coupled to the pad by an electrostatically dissipative material, wherein the coupling layer comprises an anisotropic conductive film.

15. A cable as recited in claim 1, further comprising an antistatic layer.

16. A cable having an electrostatic discharge (ESD) dissipative layer, comprising:
   at least 16 leads;
   an ESD dissipative layer; and
   a coupling layer between the leads and the ESD dissipative layer,
   the coupling layer electrically connecting each of the leads, individually, to the ESD dissipative layer.

17. A cable as recited in claim 16, wherein the coupling layer comprises an anisotropic conductive film.

18. A cable as recited in claim 16, wherein the coupling layer comprises an ESD dissipative adhesive.

19. A cable as recited in claim 16, wherein the coupling layer comprises an electrically conductive adhesive having a thickness no greater than that which provides electrical communication between the leads and the ESD dissipative layer in a direction perpendicular to the plane of the coupling layer.

20. A method for fabricating a cable, the method comprising:
   coupling an electrostatic discharge (ESD) dissipative layer to a plurality of leads using a coupling layer between the leads and the ESD dissipative layer, the coupling layer electrically connecting each of the leads, individually, to the ESD dissipative layer.

* * * * *